(12) United States Patent
Shabra et al.

(10) Patent No.: US 10,476,456 B2
(45) Date of Patent: Nov. 12, 2019

(54) COMPARATOR HAVING A HIGH-SPEED AMPLIFIER AND A LOW-NOISE AMPLIFIER

(71) Applicant: MediaTek Inc., Hsin-Chu (TW)

(72) Inventors: Ayman Shabra, Woburn, MA (US); Michael A. Ashburn, Jr., Groton, MA (US)

(73) Assignee: MediaTek Inc., Hsin-Chu (TW)

( * ) Notice: Subject to any disclaimer, the term of this patent is extended or adjusted under 35 U.S.C. 154(b) by 248 days.

(21) Appl. No.: 15/465,667

(22) Filed: Mar. 22, 2017

(65) Prior Publication Data
US 2018/0097487 A1   Apr. 5, 2018

Related U.S. Application Data

(60) Provisional application No. 62/403,731, filed on Oct. 4, 2016.

(51) Int. Cl.
*H03F 3/45* (2006.01)
*H03K 3/00* (2006.01)
(Continued)

(52) U.S. Cl.
CPC ..... *H03F 3/45183* (2013.01); *H03F 3/45475* (2013.01); *H03K 3/00* (2013.01);
(Continued)

(58) Field of Classification Search
CPC .................................................... H03F 3/451
See application file for complete search history.

(56) References Cited

U.S. PATENT DOCUMENTS 4,237,387 A * 12/1980 Devendorf .......... H03M 1/0872
                                                              327/223
6,111,437 A    8/2000 Patel
(Continued)

FOREIGN PATENT DOCUMENTS

TW    200733546 A    9/2007
TW    201141052 A1   11/2011
(Continued)

OTHER PUBLICATIONS

Chu et al., A CMOS Voltage Comparator with Rail-to-Rail Input-Range. Analog Integrated Circuits and Signal Processing. 1999;(19):145-9.
(Continued)

*Primary Examiner* — Patricia T Nguyen
(74) *Attorney, Agent, or Firm* — Wolf, Greenfield & Sacks, P.C.

(57) ABSTRACT

A comparator is described. The comparator may be used in several applications, including in digital-to-analog converters (ADC). The comparator may comprise a high-speed amplifier, a low-noise amplifier, a controller and a bi-stable circuit. The high-speed amplifier may be activated during a first period, for example when the comparator tends to exhibit a slow response. During this period, the comparator may sacrifice the noise performance. The low-noise amplifier may be activated during a second period, for example when the difference between the signals appearing as inputs to the comparator is small. The low-noise amplifier may have a gain that is large enough to limit decision errors. The bi-stable circuit, which may be implemented using a latch, may be configured to output a signal equal to one of the supply voltages, in response to receiving the input signal from one of the stages.

20 Claims, 11 Drawing Sheets

(51) Int. Cl.
*H03K 3/356* (2006.01)
*H03K 5/24* (2006.01)
(52) U.S. Cl.
CPC . *H03K 3/356139* (2013.01); *H03K 3/356191* (2013.01); *H03K 5/249* (2013.01); *H03F 2200/294* (2013.01); *H03F 2200/411* (2013.01); *H03F 2200/78* (2013.01)

(56) References Cited

U.S. PATENT DOCUMENTS

| | | | |
|---|---|---|---|
| 6,225,864 B1 * | 5/2001 | Luu | H03C 1/04 327/246 |
| 6,693,458 B1 | 2/2004 | Barrow | |
| 6,806,744 B1 | 10/2004 | Bell et al. | |
| 8,258,864 B1 * | 9/2012 | Chan | H03F 3/45183 330/260 |
| 2006/0012408 A1 * | 1/2006 | Kushner | H03K 3/356113 327/112 |

FOREIGN PATENT DOCUMENTS

| | | |
|---|---|---|
| TW | 201143293 A1 | 12/2011 |
| TW | 201411618 A | 3/2014 |
| TW | 201630340 A | 8/2016 |

OTHER PUBLICATIONS

Fayomi et al., Low Power/Low Voltage High Speed CMOS Differential Track and Latch Comparator with Rail-to-Rail Input. IEEE International Symposium on Circuits and Systems. May 2000:653-6.

Hong et al., A 65-fJ/Conversion-Step 0.9V 200-kS/s Rail-to-Rail 8-bit Successive Approximation ADC. IEEE J. Solid-State Circuits. Oct. 2007;42(10):2161-8.

Huijsing et al., Low-Voltage Operational Amplifier with Rail-to-Rail Input and Output Ranges. IEEE Journal of Solid-State Circuits. Dec. 1985;20(6):1144-50.

Kobayashi et al., A Current-mode Latch Sense Amplifier and a Static Power Saving Input Buffer for Low-power Architecture. Symposium on VLSI Circuits Digest of Technical Papers. 1992:28-9.

Pekau et al., A Re-configurable high-Speed CMOS Track and Latch Comparator with Rail-to-Rail Input for IF Digitization. IEEE International Symposium on Circuits and Systems. 2005:5369-72.

Schinkel et al., A double-Tail Latch-Type Voltage Sense Amplifier with 18ps Setup+Hold Time. (ISSCC) International Solid-State Circuits Conference. 2007;17(7):3pgs.

* cited by examiner

COMPARATOR HAVING A HIGH-SPEED AMPLIFIER AND A LOW-NOISE AMPLIFIER

RELATED APPLICATIONS

This Application claims priority under 35 U.S.C. § 119(e) to U.S. Provisional Application Ser. No. 62/403,731, entitled "A RAIL-TO-RAIL COMPARATOR CIRCUIT WITH A HIGH-SPEED AND A LOW-NOISE MODE" filed on Oct. 4, 2016, which is herein incorporated by reference in its entirety.

BACKGROUND

Analog-to-digital converters (ADCs) are used in electronic circuits to convert analog signals into the digital domain. A successive approximation (SAR) ADC is a type of analog-to-digital converter that converts a continuous waveform into a digital representation commonly via a binary search through the possible quantization levels. SAR ADCs utilize comparators to compare the sampled input level with the result of a digital search iteration.

BRIEF SUMMARY

According to one aspect of the present application, a comparator is provided. The comparator may comprise a first amplification stage and a second amplification stage, the first and second amplification stages being configured to receive an input signal, and a bi-stable circuit coupled to the first and second amplification stages and configured to provide an output signal selected from two possible values, wherein the first amplification stage is configured to drive the bi-stable circuit in a first time interval and the second amplification stage is configured to drive the bi-stable circuit in a second time interval.

In some embodiments, the first amplification stage has a first gain and the second amplification stage has a second gain, wherein the second gain is greater than the first gain.

In some embodiments, the first amplification stage exhibits a first time delay and the second amplification stage exhibits a second time delay, wherein the second time delay is greater than the first time delay.

In some embodiments, the comparator further comprises a common mode generator configured to provide a common mode signal to the first and second amplification stages, wherein the common mode varies between the first and second time intervals.

In some embodiments, the common mode signal is greater in correspondence to the first time interval than it is in correspondence to the second time interval.

In some embodiments, the comparator further comprises an analog-to-digital converter configured to receive and digitize the output signal.

In some embodiments, a most significant bit (MSB) is obtained during the first time interval and a least significant bit (LSB) is obtained during the second time interval, the MSB and the LSB being representative of the input signal.

In some embodiments, the bi-stable circuit comprises a latch.

In some embodiments, the first and second amplification stages are arranged in a differential configuration.

In some embodiments, the first amplification stage comprises a single-stage amplifier.

In some embodiments, the second amplification stage comprises a multi-stage amplifier.

In some embodiments, the first amplification stage comprises at least one NMOS transistor.

In some embodiments, the second amplification stage comprises at least one PMOS transistor.

According to another aspect of the present application, a method is provided. The method may comprise activating a first amplification stage during a first time interval, with the first amplification stage, causing, during the first interval, a bi-stable circuit to output an output signal selected from two possible values, activating a second amplification stage during a second time interval, and with the second amplification stage, causing, during the second interval, the bi-stable circuit to output the output signal.

In some embodiments, activating the first amplification stage comprises pre-charging the bi-stable circuit.

In some embodiments, the first amplification stage exhibits a first time delay and the second amplification stage exhibits a second time delay, wherein the second time delay is greater than the first time delay.

In some embodiments, the method further comprises digitizing the output signal with an analog-to-digital converter in a plurality of iterations.

In some embodiments, the first time interval comprises a first iteration of the plurality of iterations.

In some embodiments, the second time interval comprises a last iteration of the plurality of iterations.

In some embodiments, the first amplification stage has a first gain and the second amplification stage has a second gain, wherein the second gain is greater than the first gain.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

Figure 1A:
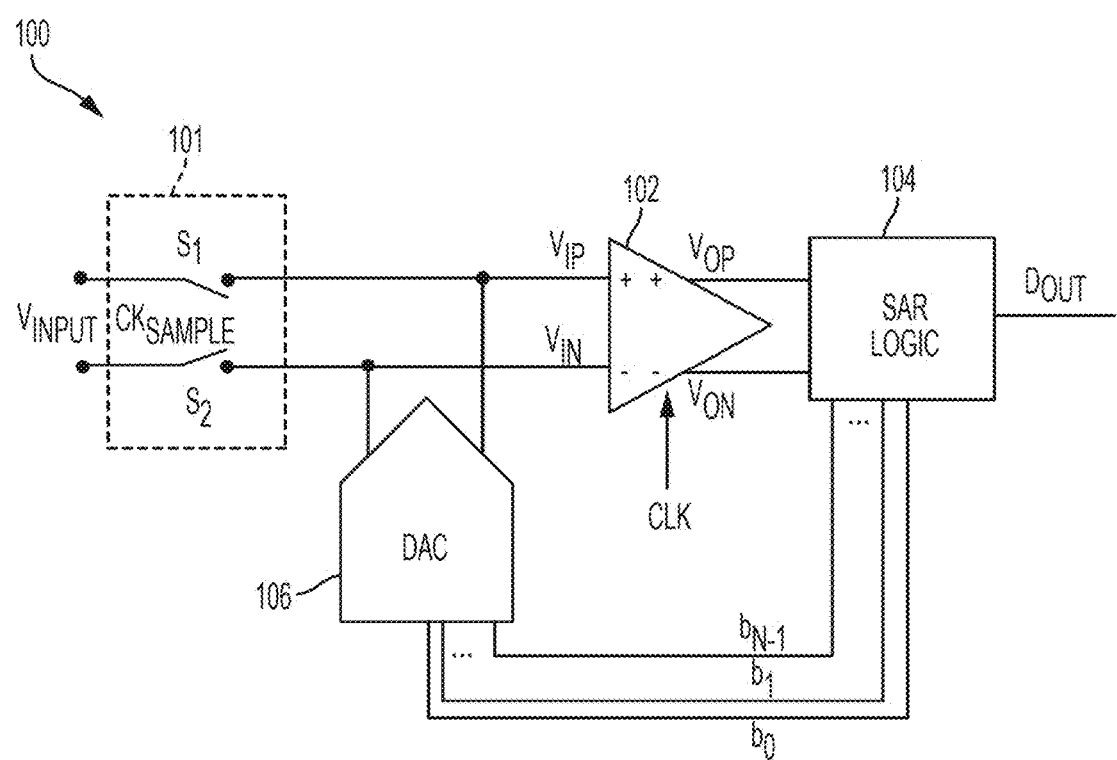
FIG. 1A is a block diagram illustrating an analog-to-digital converter, according to some non-limiting embodiments.

The inventors have recognized a challenge in the design of comparators, such as comparators for successive approximation (SAR) analog-to-digital converters (ADCs). As the size of integrated transistors decreases (e.g., as the complementary metal-oxide-semiconductor (CMOS) fabrication node decreases), smaller transistors are less able to handle the voltage stresses, thus limiting the maximum voltage with which a circuit including such transistors can be supplied. As a result of this reduction in the supply voltage, the comparator's input devices may operate under a low overdrive voltage as the input common mode varies within the expected operating range. The ability to drive large currents from the input transistors is diminished, thus reducing the speed at which the comparator reaches a decision.

To overcome this limitation, some analog-to-digital converters utilize rail-to-rail comparators, which are known to accommodate a large input common mode range. Rail-to-rail comparators are comparators designed to operate properly even when the input common mode voltage is equal to or in close proximity to one of the rails (i.e., the supply voltages). However, the use of conventional rail-to-rail comparators poses serious limitations due to their high power consumption, as a high level of power may be used to operate linearly close to a rail.

The inventors have appreciated that successive approximation (SAR) ADCs, which iterate through a number of comparator decision cycles (referred to herein simply as "iterations"), are often slow throughout the first iterations (e.g., the first iteration, the first two iterations, the first three iterations, or any suitable number of iterations) and become faster as the iterations progress. The poor time response associated with the first iterations may be due to the fact that, when the voltages appearing as common mode input to the comparator is at its maximum, the current flowing in the comparator may not be sufficiently large to drive the comparator at the desired speed. However, as the input common mode voltage decreases, the current may increase, thus causing the comparator to respond more promptly.

The inventors have further appreciated that the comparator may be more tolerant to noise throughout the first iteration(s), due to the fact that the redundancy designed into the subsequent iterations provides a method to correct for comparator decision errors in the first iteration(s). In the subsequent iterations the comparator is less tolerant to noise, when the difference in the voltages appearing as inputs to the comparator is small and there is no additional redundant SAR cycles remaining. As the difference between the inputs to the comparator is reduced, the sensitivity to noise is exacerbated, as even a small amount of noise may lead the comparator to incur in a decision error.

The inventors have developed a comparator configured to take advantage of the speed-noise trade-off as the SAR ADC cycles through the binary search. In some embodiments, a comparator input stage may be configured to use a "high-speed amplifier" when noise performance is not critically important, and to use a "low-noise amplifier" when noise performance becomes more critical. When using the high-speed amplifier, the comparator may sacrifice its noise performance in order to improve its ability to respond promptly. When using the low-noise amplifier, the comparator may be configured to limit the effects of noise on the decision process. In this way, the speed of the comparator may be improved while affecting its noise performance only when its susceptibility to noise is limited.

In some embodiments, a comparator may use the high-speed amplifier and/or the low-noise amplifier based on the magnitude of a common mode signal received by the comparator. For example, a common mode signal having a magnitude large enough to activate the high-speed amplifier may be provided throughout the first iterations, when the comparator exhibits a slow response. In contrast, a common mode signal having a magnitude small enough to activate the low-noise amplifier may be provided throughout the subsequent iterations, when the comparator is more susceptible to noise. In this way, the delay associated with the first bits may be limited without sacrificing the overall noise performance of the comparator.

In some embodiments, a comparator may comprise a bi-stable circuit and a plurality of amplification stages, including a "high-speed amplifier" and a "low-noise amplifier". The amplification stages may receive the input signals to be compared, and may drive the bi-stable circuit. Depending on whether the difference in the input signals is positive or negative, the bi-stable circuit may toggle to a logic 0 (e.g., to ground), or to a logic 1 (e.g., to the supply voltage). The high-speed amplifier may configured to drive enough current to limit the comparator's delay. The low-noise amplifier may exhibit a voltage gain large enough to limit the probability of noise-induced decision errors.

While comparators of the type described herein are described in connection with SAR ADCs, it should be appreciated that the application is not limited in this respect. Accordingly, comparators of the type described herein may be used in any situation in which multiple signals are to be compared.

FIG. 1A is a block diagram illustrating an analog-to-digital converter (ADC), according to some non-limiting embodiments. ADC 100 may be configured to operate as a successive approximation (SAR) ADC in some embodiments. As such, the ADC may receive an input signal from a sampling circuit, and may iterate until the search converges. ADC 100 may include sampling circuit 101, comparator 102, SAR logic circuitry 104, and digital-to-analog converter (DAC) 106. In some embodiments, the input signal $V_{input}$ may be a differential signal, though single ended signals may alternatively be used. In such embodiments, sampling circuit 101 may include switches $S_1$ and $S_2$. The switches may sample differential signal $V_{input}$. Clock $CK_{sample}$ may be used to time the sampling of $V_{input}$. The sampled signal may be combined with the output of DAC 106, and the resulting signals may be provided as inputs to the comparator 102. If the input sampled signal is greater than the output of the DAC, the comparator may toggle to a logic 1. In contrast, if the input sampled signal is lower than the output of the DAC, the comparator may toggle to a logic 0. It should be appreciated that the opposite logic may alternatively be used. The result of the comparison may be stored in the SAR logic circuitry 104. The SAR logic circuitry 104 may include an N-bit register for storing the bits obtained as outputs to the comparator throughout the successive iterations. For example, the most significant bit (MSB) may be set in response to the first iteration. The MSB may be stored as bit $b_0$. Once $b_0$ has been set in response to a comparison, DAC 106 may convert the digital word including bits $b_0$, $b_1$, $b_{N-1}$ into an analog signal. In the second iteration, the newly converted analog signal may be combined to the sampled input signal and the result may be compared using comparator 102. The output of the comparator may be stored in the SAR register as bit $b_1$. Once again, DAC 106 may convert the updated digital word including bits $b_0$, $b_1$, $b_{N-1}$ into an analog signal and another iteration may take place. The iterations may continue until the least significant bit (LSB), corresponding to bit $b_{N-1}$, is set. The resulting digital word may provide a digital representation of the input signal. The iterations may be timed using clock signal CLK.

Figure 1B:
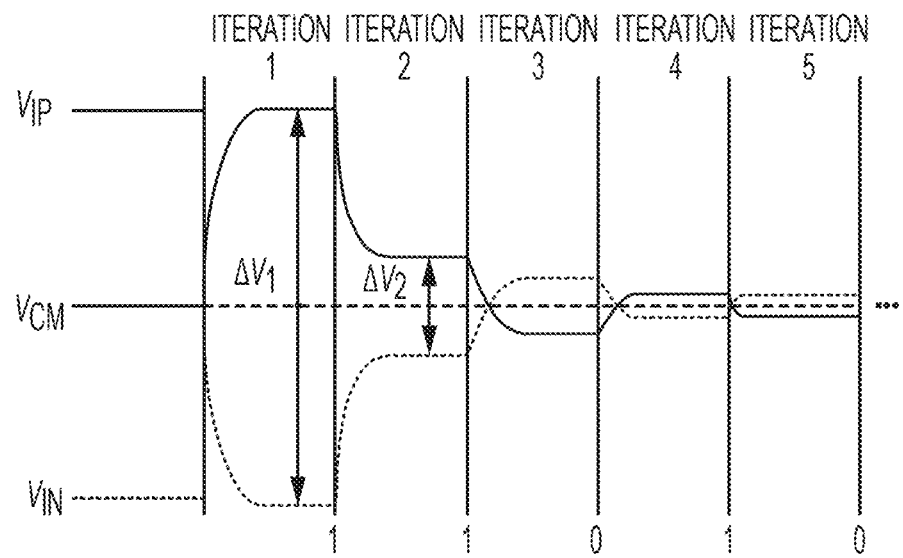
FIG. 1B is a plot illustrating input signals having a constant common mode, according to some non-limiting embodiments.

In some embodiments, the signals appearing as inputs to the comparator may have a constant common mode throughout the iterations of the SAR ADC. FIG. 1B illustrates one example in which the input signals have a constant common mode. As illustrated, the input signals $V_{in}$, and $V_{ip}$, which appear as inputs to comparator 102, have a common mode $V_{cm}$ that is equal to their average and is constant throughout the iterations of the SAR ADC. After each iteration, the difference $\Delta V$ between $V_{ip}$ and $V_{in}$, is reduced, and a logic 0 is produced when $V_{in}$, is greater than $V_{ip}$ and a logic 1 is produced when $V_{in}$, is lower than $V_{ip}$. While this configuration may be simple to implement, it may cause significant power consumption in the DAC 106. This may be due to a reduction in the total energy required during the sequence of all iteration cycles to alter the voltage and hence the charge stored in the capacitors of DAC 106.

Figure 1C:
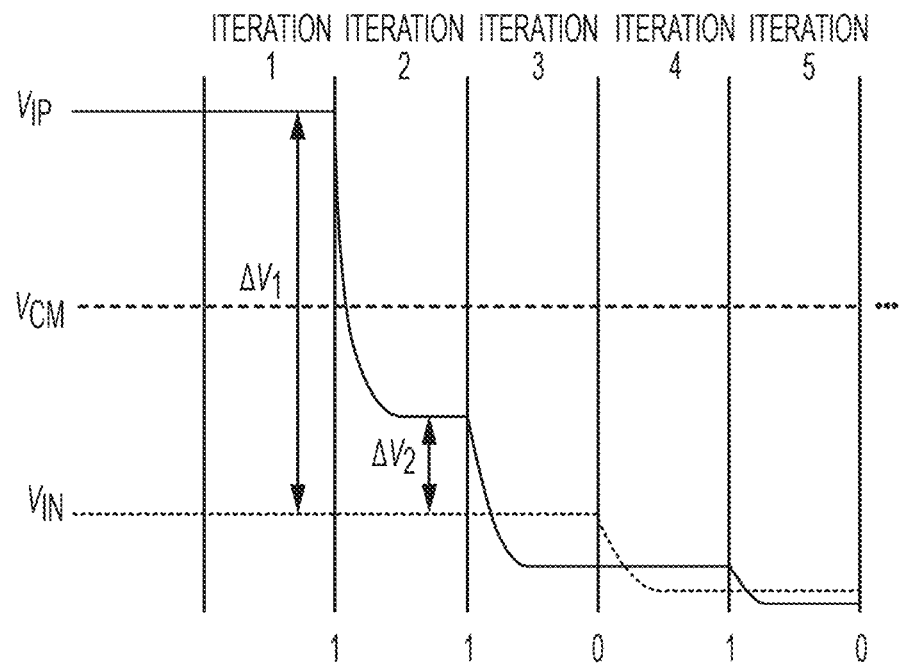
FIG. 1C is a plot illustrating input signals having a time-varying common mode, according to some non-limiting embodiments.

To obviate this problem, in some embodiments, a time-varying common mode signal may be added to the differential input signal. In this way, the total energy required during the sequence of all SAR iterations to vary the charge of the capacitors may be reduced, and as a result the power absorbed by the DAC may be limited. In some embodiments, the common mode signal may be varied throughout the iterations of the SAR ADC. For example, the common mode signal may decay throughout the iterations of the SAR ADC. FIG. 1C is a plot illustrating one example of a time-varying common mode signal. As illustrated, the common mode signal associated with the input differential signal (which may be proportional to $V_{in}+V_{ip}$) may be equal to $V_{cm}$ before the first iteration of the SAR ADC, and may subsequently decay. As a result, the average of $V_{in}$, and $V_{ip}$ also decays. As in the case illustrated in FIG. 1B, a logic 0 is produced when $V_{in}$, is greater than $V_{ip}$ and a logic 1 is produced when $V_{in}$, is lower than $V_{ip}$, though the opposite logic may be alternatively be used. FIG. 1C further illustrates that the difference $\Delta V$ between $V_{ip}$ and $V_{in}$, may decay, in absolute value, as the binary search progresses. For example, the figure illustrates $\Delta V_2$ being less than $\Delta V_1$. Because the difference $\Delta V$ is initially large, the comparator may be relatively insensitive to noise throughout the first iterations. That is, even if noise is present, it is unlikely that the noise would cause a decision error. As the difference $\Delta V$ decreases, the comparator may be more susceptible to noise, and decision errors may arise.

Figure 1D:
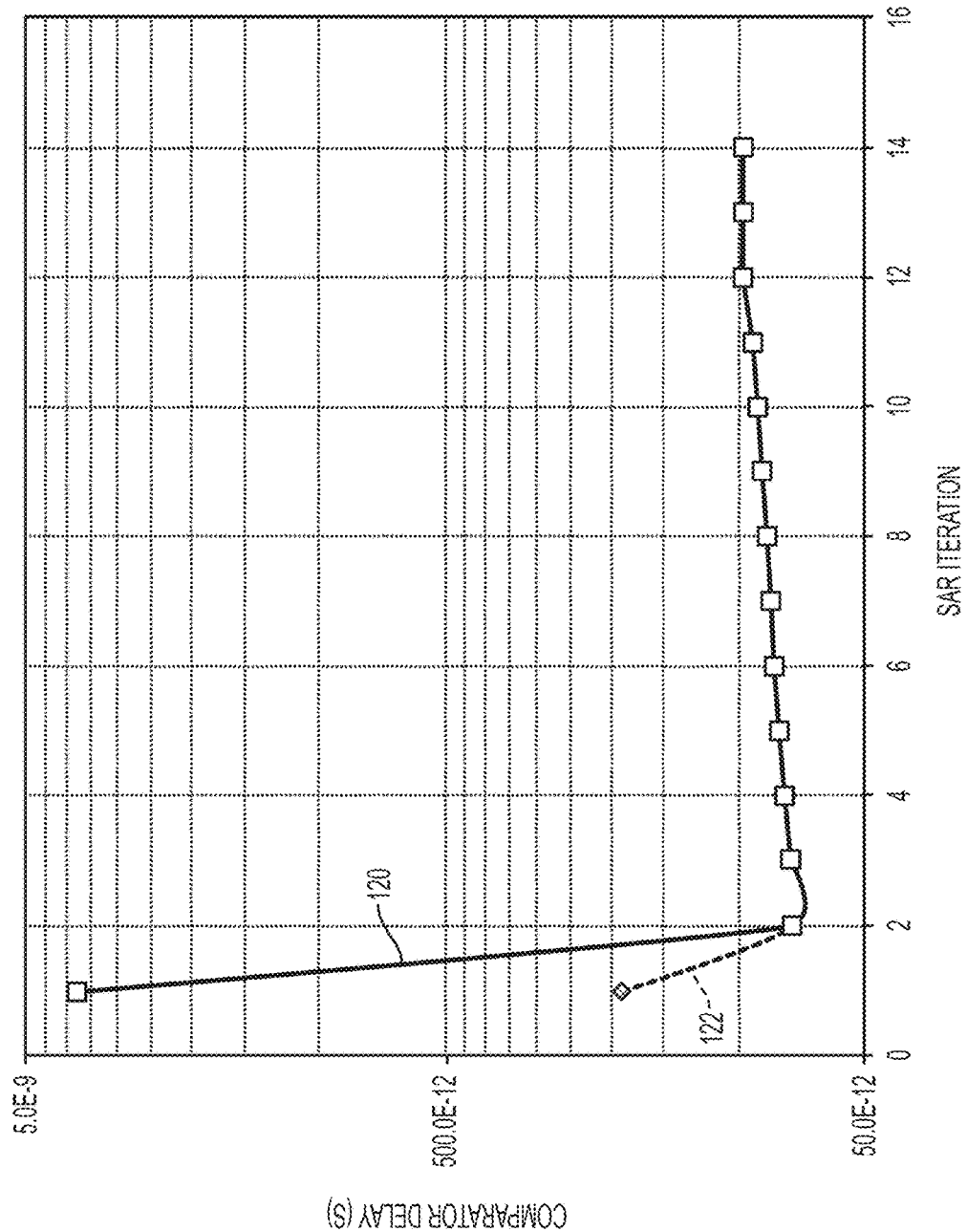
FIG. 1D is a plot illustrating the delay associated with a comparator throughout the iterations of a successive approximation (SAR) analog-to-digital converter, according to some non-limiting embodiments.

However, the delay introduced by the comparator may be exacerbated throughout the first iterations, and may be less severe as the binary search progresses. The delay introduced throughout the first iterations may be due to the fact that, since the common mode signal is large, the current flowing through the comparator may be limited, thus causing the comparator to exhibit a slow response. FIG. 1D is a plot illustrating an example of the delay introduced by the comparator throughout the iterations of a SAR ADC. Curve 120 represents the delay associated with comparator 102, in some circumstances. As illustrated, the delay may be severe throughout the first iteration, while it may be less significant throughout the following iterations. In the example illustrated, the delay introduced in the first iteration is almost two orders of magnitude greater than the delay introduced in the following iterations.

The inventors have appreciated that a trade-off exists between the delay introduced by a comparator and its susceptibility to noise. In some circumstances, a comparator may be configured to promote a fast time response in exchange for a degradation in the noise performance. Such a configuration may be implemented when the comparator suffers from a slow response, e.g., throughout the first iterations of the SAR ADC. In other circumstances, the comparator may be configured to promote an improved noise performance Such a configuration may be implemented when the comparator is more susceptible to noise, e.g., throughout the subsequent iterations of the SAR ADC.

Accordingly, a comparator may be configured to operate in at least two modes. In the first mode, which will be referred to herein as the "high-speed mode", the comparator may use the high-speed amplifier and may sacrifice its signal-to-noise ratio in exchange for a fast time response. In some embodiments, the high-speed amplifier may be used during the first iterations of the SAR ADC. In the second mode, which will be referred to herein as the "low-noise mode", the comparator may use the low-noise amplifier and may be configured to limit noise, at the expense of as fast time response. In some embodiments, the low-noise amplifier may be used during the subsequent iterations of the SAR ADC. It should be appreciated that, while the embodiments described herein use the high-speed amplifier throughout the first iterations and the low-noise amplifier throughout the subsequent iterations, the application is not limited in this respect and the opposite configuration, or any other alternative configuration may be used.

An example of a comparator configured to operate according to the modes described above is illustrated in FIG. 2A. Comparator 202, which may serve as comparator 102 of FIG. 1A, may include a low-noise amplifier 210, a high-speed amplifier 212, a controller 214 and a bi-stable circuit 216. Optionally, comparator 202 may be coupled to common mode (CM) generator 118. In some embodiments, CM generator 118 may provide a common mode signal to both of the input terminals of comparator 202. In addition, CM generator 118 may be configured to vary the magnitude of the common mode signal to cause the comparator to use the high-speed amplifier during a certain period of time, and to use the low-noise amplifier during another period of time. For example, CM generator may provide a large common mode signal throughout the first iterations of the SAR ADC, thereby activating the high-speed amplifier 212, and a smaller common mode signal throughout the subsequent iterations, thereby activating the low-noise amplifier 210.

High-speed amplifier 212 may exhibit a fast time response. For example, high-speed amplifier 212 may include an amplifier having a response time that is less than 50 ps, less than 30 ps, less than 20 ps, less than 10 ps, or less than 1 ps. Low-noise amplifier 210 may exhibit a low-noise response. For example, low-noise amplifier 210 may include an amplifier having a large voltage gain (e.g., greater than 5, greater than 10, greater than 20, or greater than 30). In some embodiments, low-noise amplifier 210 may include a multi-stage amplifier.

Controller 214 may provide high-speed amplifier 212 and low-noise amplifier 210 with a time reference signal. For example, controller 214 may generate clock signal CLK. In some embodiments, instead of relying on CM generator 118 to activate high-speed amplifier 212 and/or low-noise amplifier 210, controller 214 may be used. In such embodiments, controller 214 may drive gating circuits for activating the desired amplifier, as will be described further below. In other embodiments, the high-speed amplifier and the low-noise amplifier may be activated without having to use controller 214.

Bi-stable circuit 216 may be a circuit configured to receive a signal between the lower supply voltage (e.g., ground) and the upper supply voltage, and to output a voltage that is either equal to the lower supply voltage or the upper supply voltage. For example, if the signal received is above a threshold, a signal equal to or proximate the upper supply voltage may be output. In contrast, if the signal received is below the threshold, a signal equal to or proximate the lower supply voltage may be output. In some embodiments, the threshold may be set to approximately the midpoint between the upper supply voltage and the lower supply voltage. Bi-stable circuit 216 may be implemented in any suitable way. For example, bi-stable circuit 216 may be implemented using a latch.

Figure 2A:
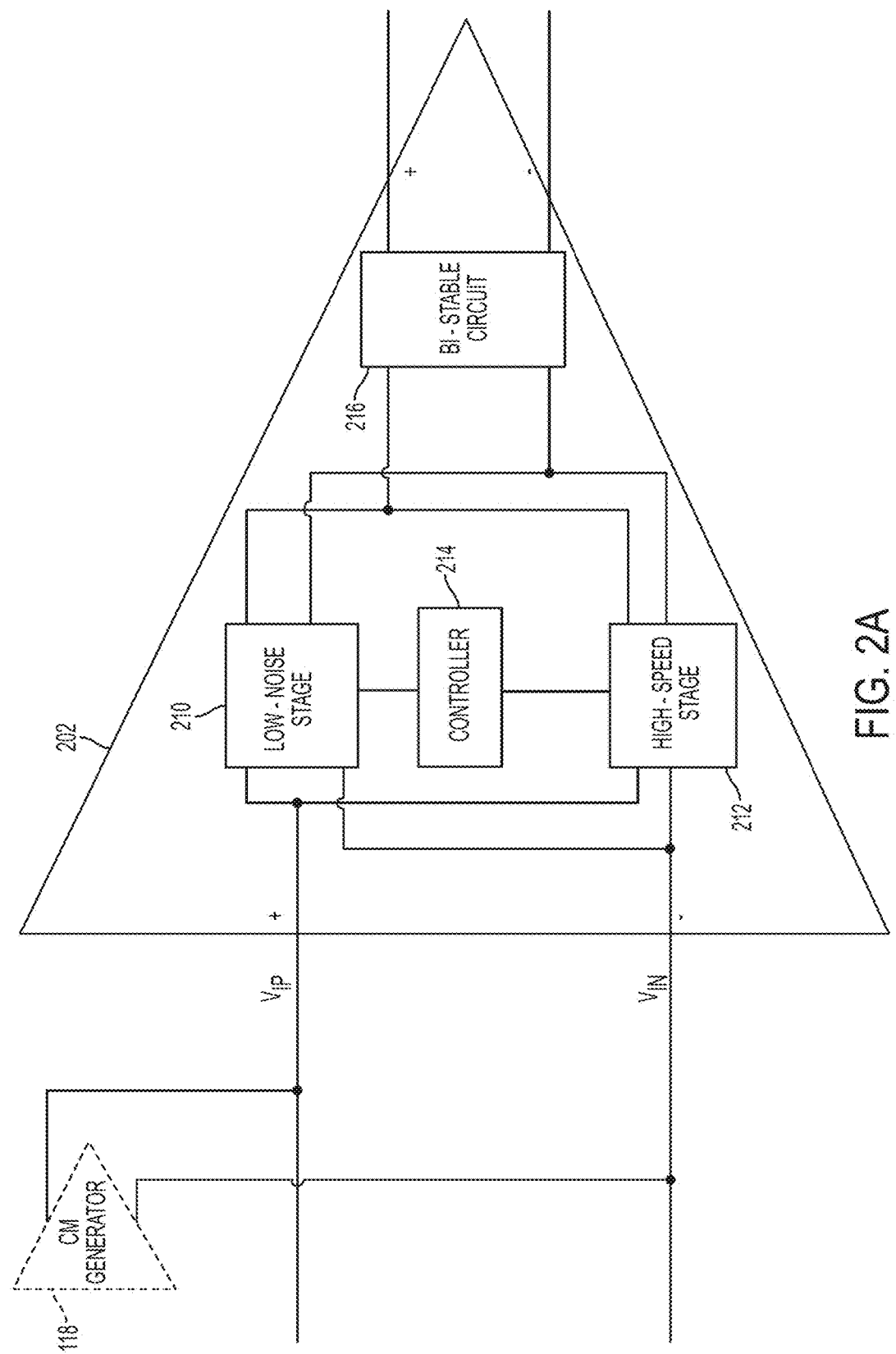
FIG. 2A is a block diagram illustrating a comparator, according to some non-limiting embodiments.
Figure 2B:
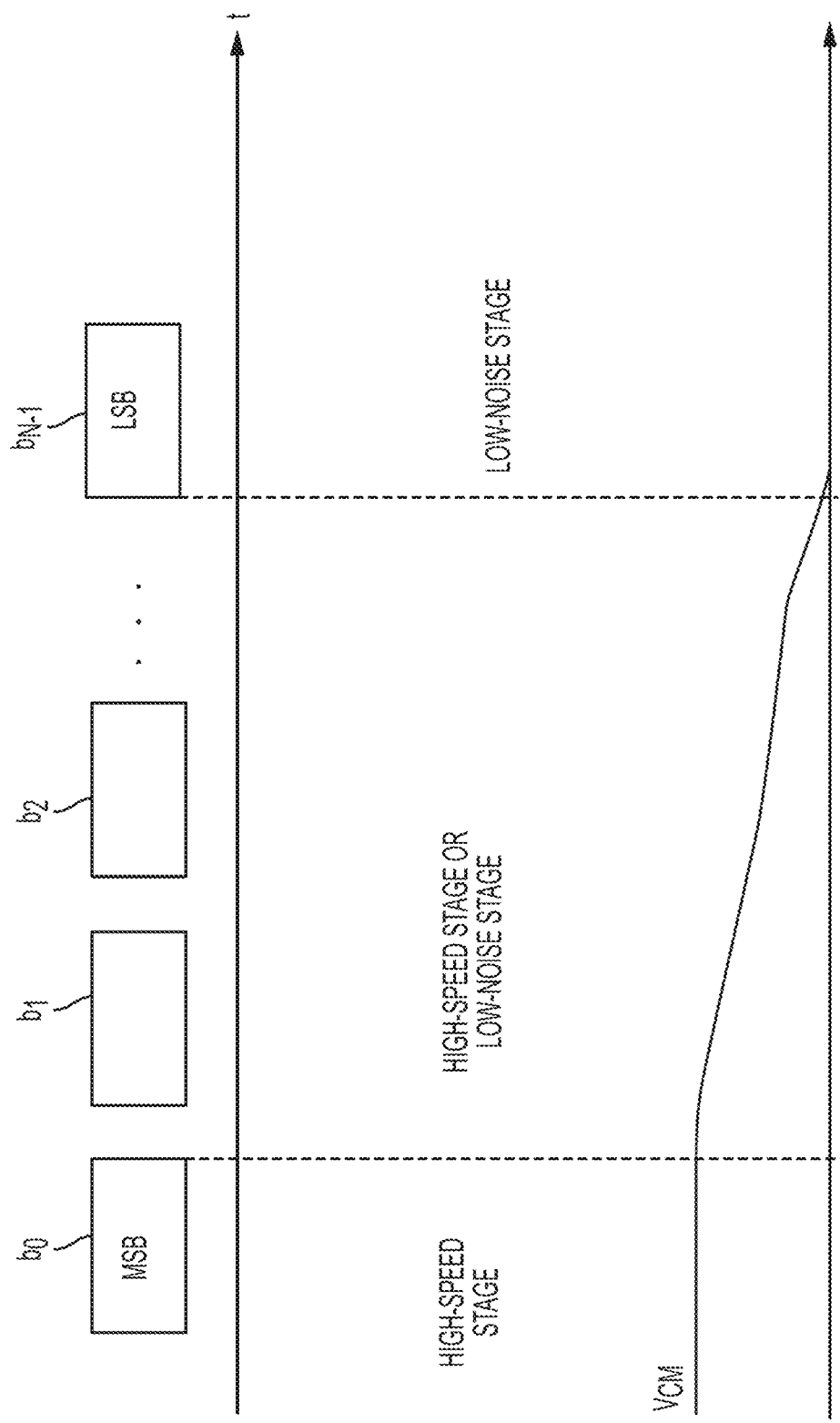
FIG. 2B is a diagram illustrating a common mode signal as it varied throughout the iterations of a SAR analog-to-digital converter, according to some non-limiting embodiments.

As described in connection with CM generator 118, the magnitude of the common mode signal may be varied throughout the iterations of the SAR ADC. FIG. 2B illustrates an example of how the common mode signal may be varied in some embodiments. As illustrated, the common mode signal may be large in correspondence with the first iteration, when the most significant bit (MSB) $b_0$ is set. During this iteration, the high-speed amplifier may be active. In contrast, the common mode signal may be small (e.g., approximately zero) in correspondence with the last iteration, when the least significant bit (LSB) $b_{N-1}$ is set. During this iteration, the low-noise amplifier may be active. Throughout the intermediate iterations, depending on the delay introduced in the ADC, either the high-speed amplifier or the low-noise amplifier, or both, may be active. For example, the comparator may activate the low-noise amplifier after the first, after the second iteration, after the third iteration, after the fourth iteration, or after any suitable iteration.

In some embodiments, comparator 202 may be implemented using an integrated circuit, and any suitable type of transistors may be used. For example, comparator 202 may use metal oxide semiconductor field effect transistors (MOSFETs), bipolar junction transistors (BJTs), junction field effect transistors (JFET), or any suitable combination thereof. In some embodiments, the high-speed amplifier 212 may be implemented using an amplifier having a large output current so as to cause the comparator to respond promptly. In some embodiments, high-speed amplifier 212 may utilize NMOS transistors. Compared to PMOS transistors, NMOS transistor may be able to drive larger currents, in some embodiments. This may be due, for example, to the fact that electrons may have a larger mobility than holes, when certain materials (e.g., silicon) are used. However, it should be appreciated that the application is not limited in this respect, and PMOS transistors or other types of transistors may alternatively, or additionally, be used. In some embodiments, the low-noise amplifier 210 may be implemented using a multi-stage amplifier so as to increase the voltage gain and increase the magnitude of the signal with respect to the noise.

Figure 3A:
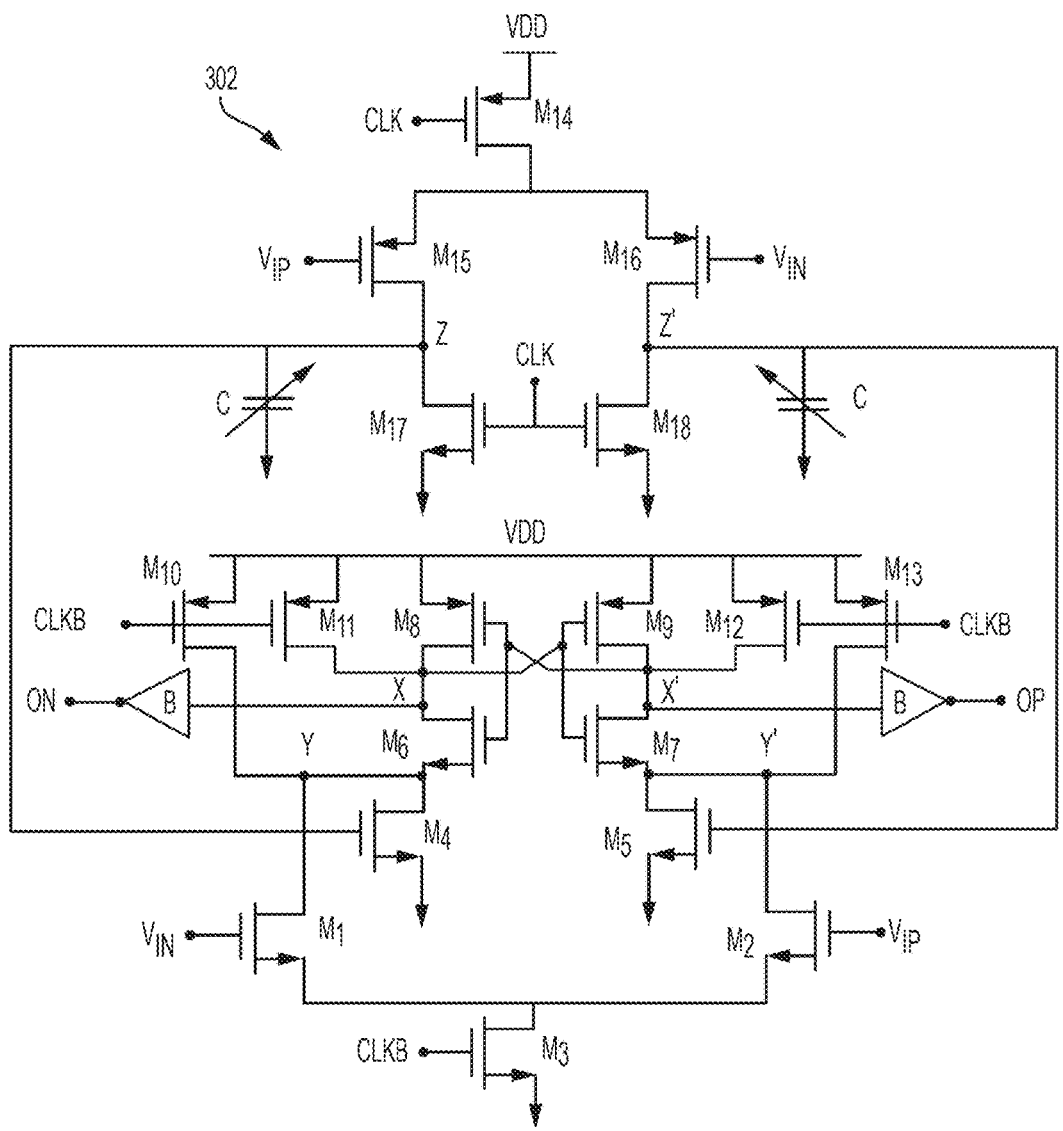
FIG. 3A is a circuit diagram illustrating a comparator, according to some non-limiting embodiments.

FIG. 3A is a circuit diagram illustrating an example of an implementation of comparator 202. Comparator 302 may receive supply voltage $V_{DD}$, which may be less than 1V, less than 0.95V, less than 0.9V, less than 0.85V, less than 0.8V, or less than any suitable voltage. The lower supply voltage may be connected to ground. However, other implementations using negative supply voltages may be used. The high-speed amplifier may include transistors M1, M2, and M3. Transistors M1 and M2 may collectively form a differential common-source amplification stage. Transistor M3 may be used to bias transistors M1 and M2, in accordance with clock signal CLKB, as will be described further below. The low-noise amplifier may include transistors M14, M15, M16, M4 and M5, and capacitors C. Transistors M15 and M16 may collectively form a differential common-source amplifier. While PMOS transistors are used as transistors M15 and M16 in the example illustrated, NMOS transistors may alternatively be used. Transistor M14 may be used to bias transistors M15 and M16, in accordance with clock signal CLK. Clock signals CLK and CLKB may be in phase, and opposite one another. Transistors M15 and M16 may serve as the first amplification stage of low-noise amplifier 210. The second amplification stage may be implemented using transistors M4 and M5, which may be arranged in a common-source configuration.

The output terminals of high-speed amplifier 210, as well as the output terminals of low-noise amplifier 212, may be connected to nodes Y and Y'. Y and Y' may serve as input nodes to the bi-stable circuit, which may include transistors M6, M7, M8 and M9. These transistors may be connected to form a latch, in some embodiments. As such, these transistors may either output a voltage substantially equal to $V_{DD}$ or substantially equal to 0, depending on the difference between $V_{in}$ and $V_{ip}$. When these transistors output a voltage substantially equal to $V_{dd}$ at node X, they may output a voltage substantially equal to 0 at node X'. Buffers B may be used to output the voltages to output terminals ON and OP. As will be described further below, transistors M10, M11, M12, M13, M17 and M18 may be used for pre-charging.

As described in connection with FIG. 2B, the common mode signal provided by GM generator 118 may be large initially. The term "large" is used herein to indicate a voltage large enough to activate high-speed amplifier 212 and turn-off low-noise amplifier 210. For example, if $V_{DD}$ is equal to 0.85V, the initial common mode signal may be set to approximately 0.5V. As a result, transistors M1 and M2, throughout the first iteration, may operate above threshold, thus activating the high-speed amplifier. In contrast, transistors M15 and M16, throughout the first iteration, may operate below threshold, thus making the low-noise amplifier inactive.

Figure 3B:
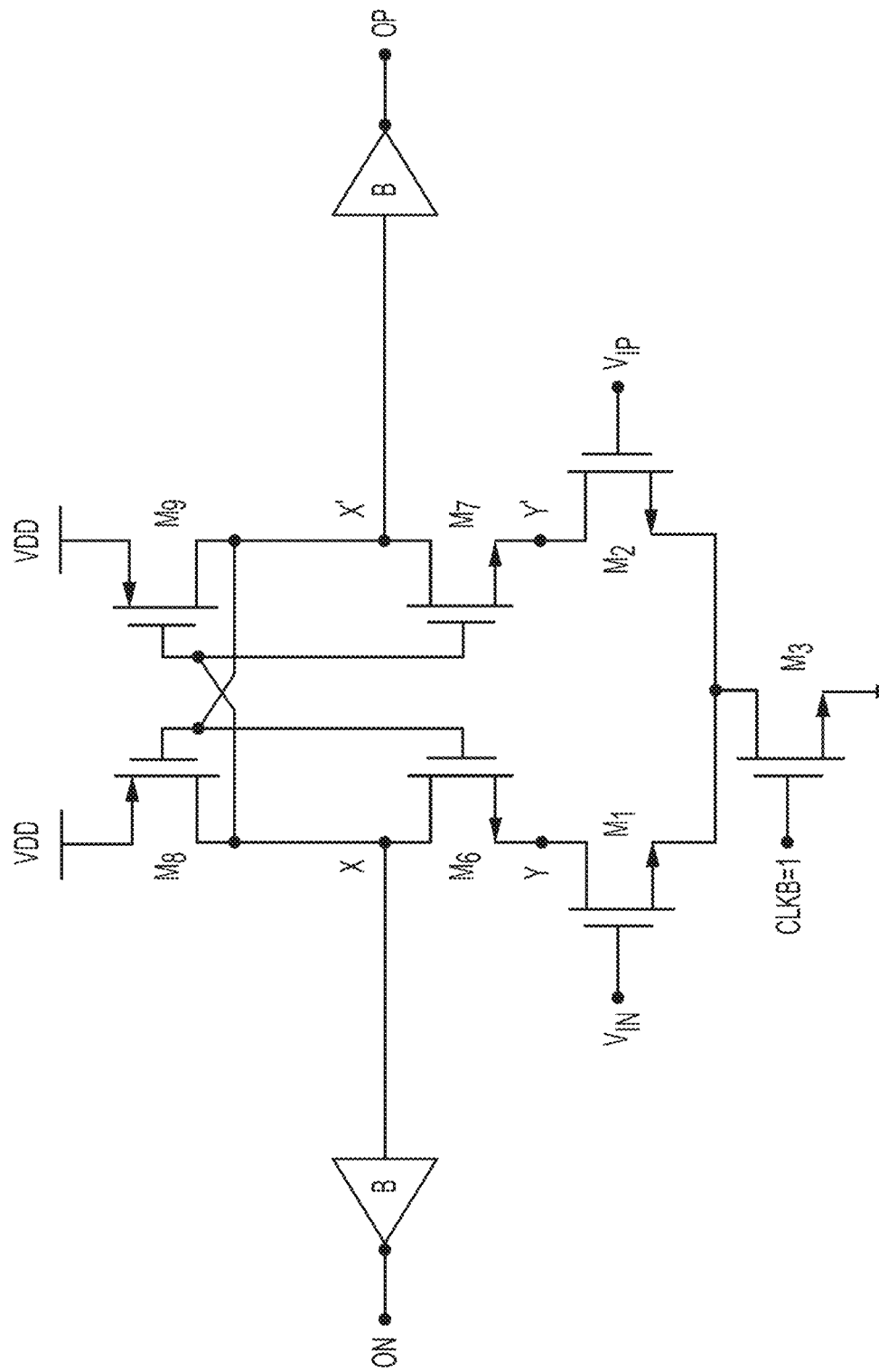
FIG. 3B is a circuit diagram illustrating the comparator of FIG. 3A when using a high-speed amplifier, according to some non-limiting embodiments.
Figure 3C:
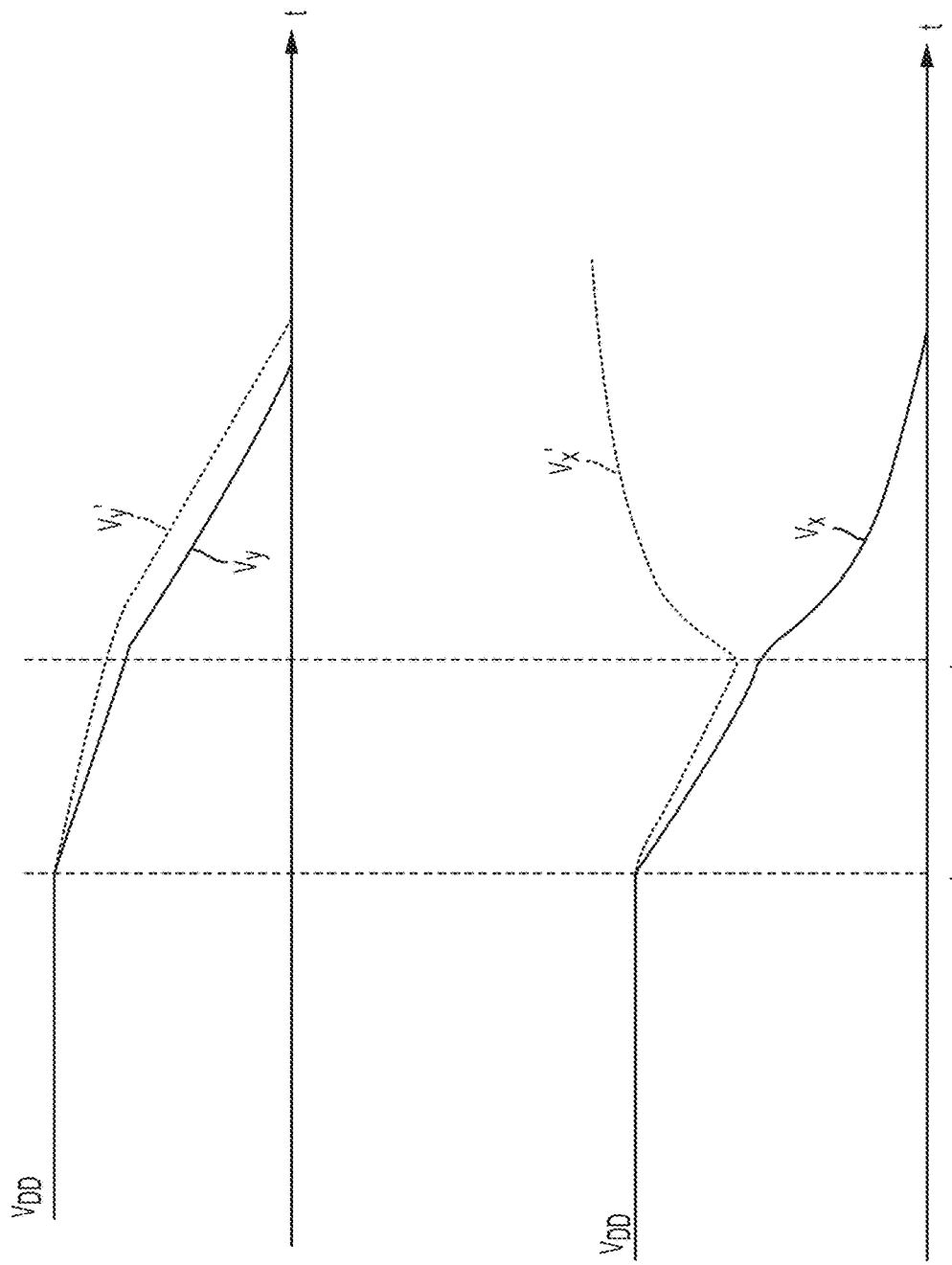
FIG. 3C is a plot illustrating a plurality of output signals used in connection with the comparator of FIG. 3C, according to some non-limiting embodiments.

FIG. 3B illustrates comparator 302 throughout the first iteration. During the first iteration, the comparator may operate in one of two phases: a first phase, referred to herein as the "pre-charge phase" and second phase, referred to herein as the "decision phase". In the pre-charge phase, transistors M10, M11, M12, and M13 may be active, and may force nodes Y, X, X', and Y' to approximately $V_{DD}$. These transistors may be activated when the clock signal CLKB is equal to 0. FIG. 3C is a plot illustrating the voltages Vx, Vx', Vy and Vy' appearing at nodes X, X', Y and Y' respectively. As illustrated, the pre-charge phase may occur before $t_1$. At $t_1$, clock signal CLKB may switch to 1, thus turning off transistors M10, M11, M12, and M13, and activating transistor M3. During the decision phase, which takes place after $t_1$, transistors M1 and M2 may be biased by M3, and may drive the voltages at nodes Y and Y' depending on the difference between $V_{ip}$ and $V_{in}$. For example, if $V_{in}$ is greater than $V_{ip}$, Vy may decay at a faster pace than Vy', as illustrated in FIG. 3C. When the difference between Vy and Vy' is sufficiently large, the bi-stable circuit may be triggered, and voltages Vx' and Vx may converge to $V_{DD}$ and 0, respectively. The time at which the bi-stable circuit is triggered is illustrated as $t_2$ in FIG. 3C. Vice versa, if $V_{in}$ is less than $V_{ip}$, voltages Vx' and Vx may converge to 0 and $V_{DD}$, respectively. Referring back to FIG. 1D, curve 122 illustrates the time delay associated with comparator 302. As illustrated, in the first iteration the delay is significantly decreased with respect to curve 122. Such a decrease in the delay may be due to the use of the high-speed amplifier.

Figure 3D:
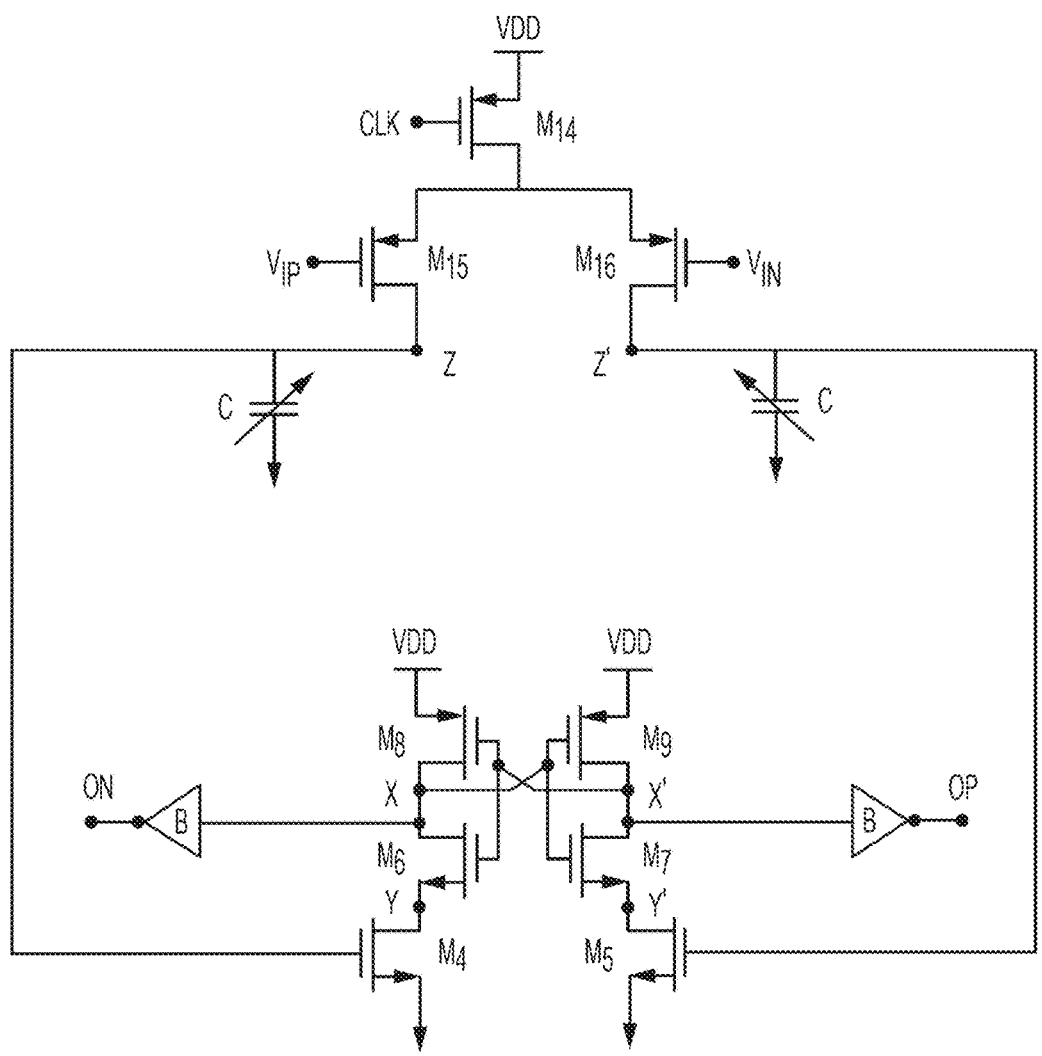
FIG. 3D is a circuit diagram illustrating the comparator of FIG. 3A when using a low-noise amplifier, according to some non-limiting embodiments.
Figure 3E:
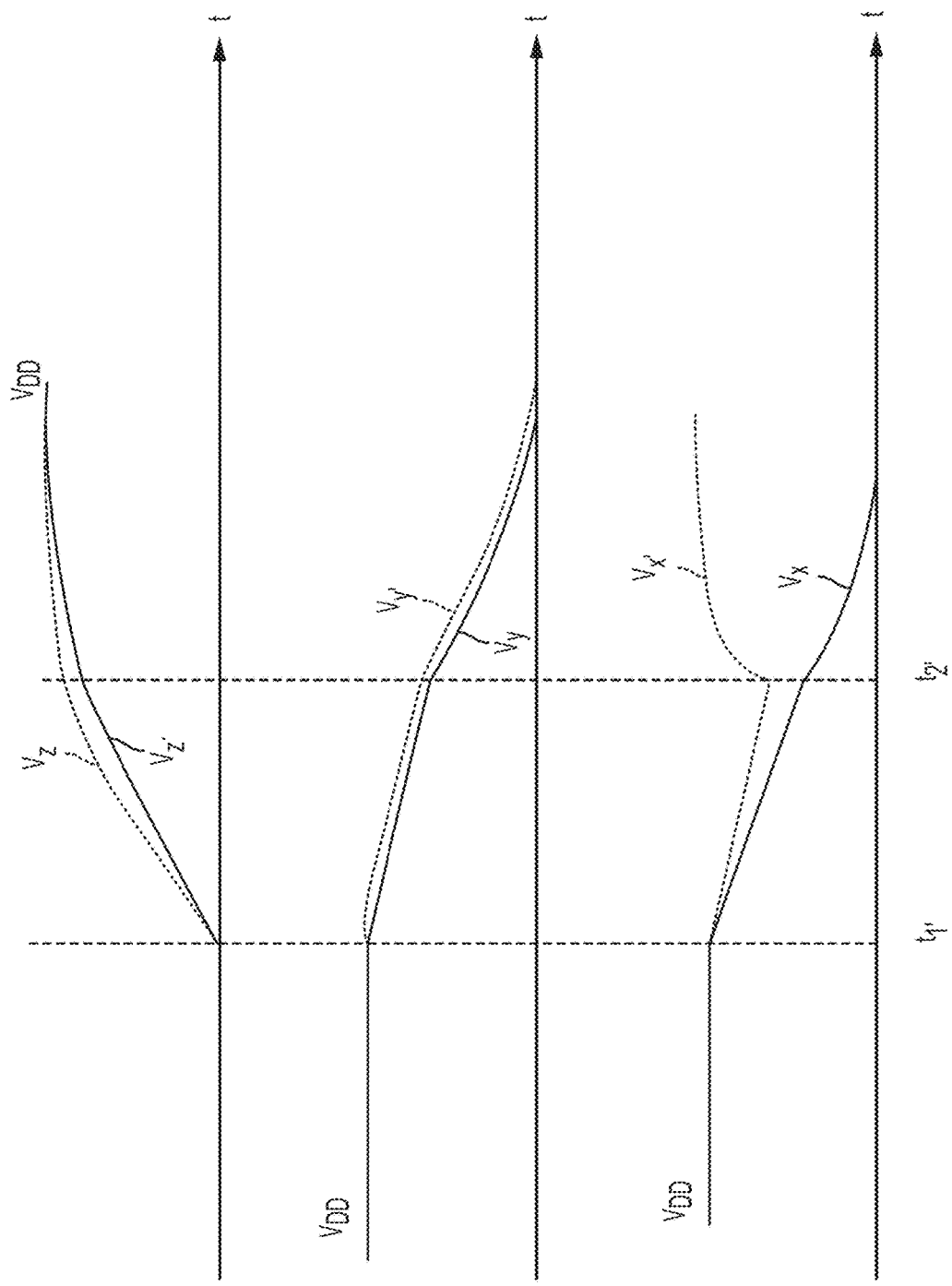
FIG. 3E is a plot illustrating a plurality of output signals used in connection with the comparator of FIG. 3D, according to some non-limiting embodiments.

Throughout the subsequent iterations, such as starting from the second iteration, the third iteration, the fourth iteration, or any suitable iteration after the first iteration, the magnitude of the common mode signal may be low enough to activate the low-noise amplifier and deactivate the high-speed amplifier. FIG. 3D illustrates comparator 302 when using the low-noise amplifier. Each iteration may also be divided into a pre-charge phase and a decision phase, depending on the level of CLK. In the pre-charge phase, transistors M17 and M18 may be turned on, thus forcing the voltages at nodes Z and Z' to approximately 0, as illustrated in FIG. 3E. Transistors M17 and M18 may be turned on when clock signal CLK is equal to 1. At $t_1$', clock signal CLK may switch to 0, and the comparator may enter the decision phase. In this phase, transistor M14 may bias transistors M15 and M16, which may drive currents into capacitors C. The resulting voltage appearing across the capacitors C may in turn drive transistors M4 and M5. As a result, transistors M15 and M16 may constitute a first amplification stage and transistors M4 and M5 may constitute a second amplification stage.

If Vin is larger than Vip, Vz may increase at a faster pace than Vz', as illustrated in FIG. 3E. In response, Vy may decay at a faster pace than Vy'. When the difference between Vy and Vy' is sufficiently large, the bi-stable circuit may be triggered, and voltages Vx' and Vx may converge to VDD and 0, respectively. The time at which the bi-stable is triggered is illustrated as t2' in FIG. 3E. Vice versa, if Vin is less than Vip, voltages Vx' and Vx may converge to 0 and VDD, respectively. When the low-noise amplifier is active, even if the difference between Vip and Vin is small, the effect of noise may be limited by the large signal gain provided by the low-noise amplifier. While comparator 302 has been shown to use the high-speed amplifier when the common mode signal is large and in the low-noise amplifier when the common mode signal is small, the opposite logic may be used in other embodiments. This may be the case if, for example, the high-speed amplifier used PMOS transistors and the first amplification stage of the low-noise amplifier used NMOS transistors.

Figure 4:
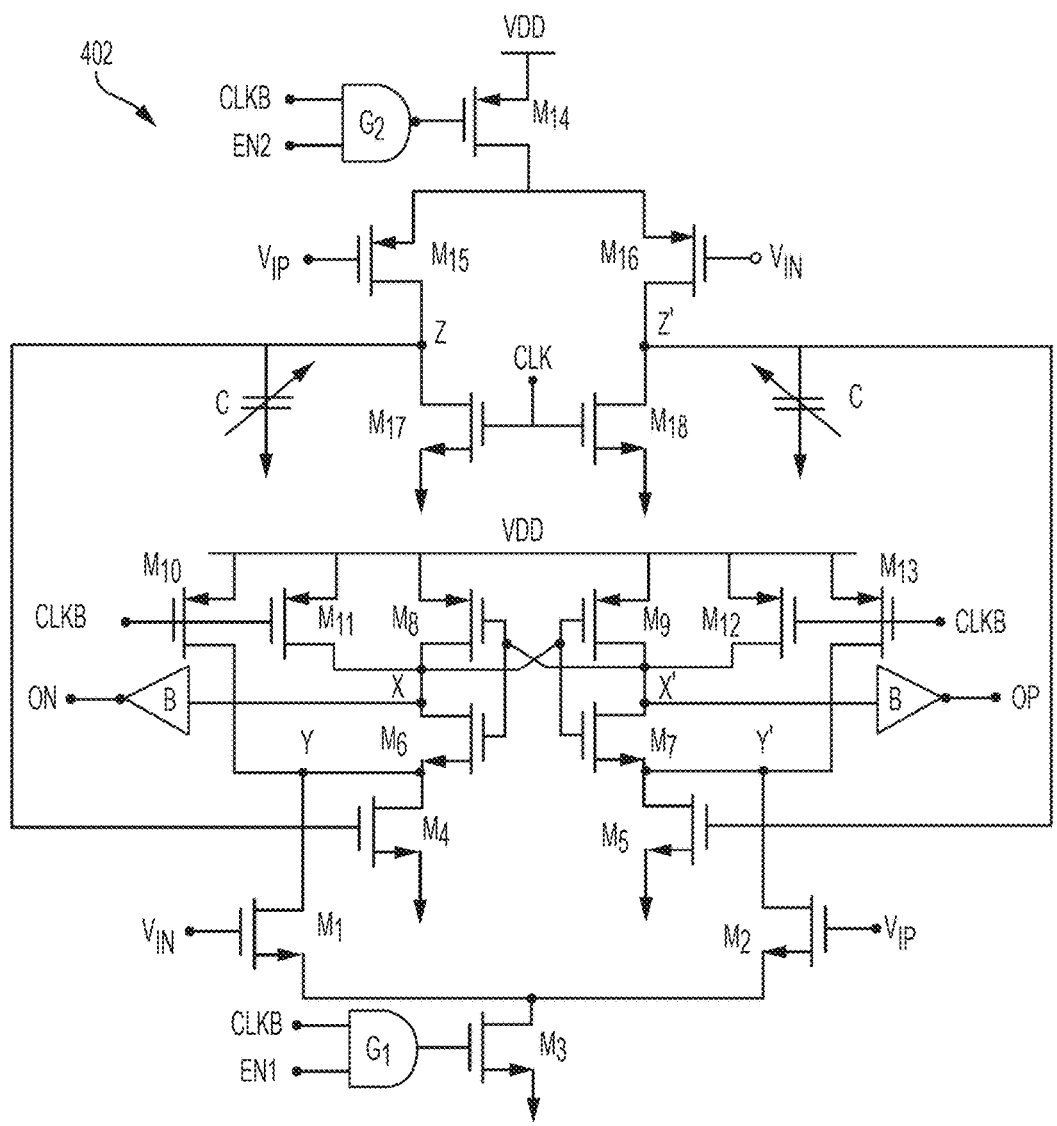
FIG. 4 is a circuit diagram illustrating another comparator, according to some non-limiting embodiments.

As described in connection with FIG. 2A, in some embodiments, instead of relying on the common mode signal to activate/deactivate the high-speed amplifier and the low-noise amplifier, controller 214 may be used. FIG. 4 illustrates a comparator in which the high-speed amplifier and the low-noise amplifier are activated by controller 214. In some embodiments, controller 214 may provide control signals $En_1$ and $En_2$. Control signal $En_1$ may enable gate $G_1$ when the high-speed amplifier is active and control signal $En_2$ may enable gate $G_2$ when the low-noise amplifier is active. In this way, CM generator 118 may no longer be used.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

What is claimed is:

1. A circuit comprising:
a successive approximation (SAR) analog-to-digital converter (ADC) comprising:
   a first amplification stage and a second amplification stage, the first and second amplification stages being configured to receive an input signal; and
   a bi-stable circuit coupled to the first and second amplification stages and configured to provide an output signal selected from two possible values;
wherein the first amplification stage is configured to drive the bi-stable circuit in a first time interval and the second amplification stage is configured to drive the bi-stable circuit in a second time interval.

2. The circuit of claim 1, wherein the first amplification stage has a first gain and the second amplification stage has a second gain, wherein the second gain is greater than the first gain.

3. The circuit of claim 1, wherein the first amplification stage exhibits a first time delay and the second amplification stage exhibits a second time delay, wherein the second time delay is greater than the first time delay.

4. The circuit of claim 1, further comprising a common mode generator configured to provide a common mode signal to the first and second amplification stages, wherein the common mode varies between the first and second time intervals.

5. The circuit of claim 4, wherein the common mode signal is greater in correspondence to the first time interval than it is in correspondence to the second time interval.

6. The circuit of claim 5, wherein the first amplification stage is active during the first interval and inactive during the second interval and the second amplification stage is inactive during the first interval and active during the second interval.

7. The circuit of claim 6, wherein a most significant bit (MSB) is obtained during the first time interval and a least significant bit (LSB) is obtained during the second time interval, the MSB and the LSB being representative of the input signal.

8. The circuit of claim 6, wherein the first amplification stage is faster than the second amplification stage.

9. The circuit of claim 1, wherein the first and second amplification stages are arranged in a differential configuration.

10. The circuit of claim 1, wherein the first amplification stage comprises a single-stage amplifier.

11. The circuit of claim 1, wherein the second amplification stage comprises a multi-stage amplifier.

12. The circuit of claim 1, wherein the first amplification stage comprises at least one NMOS transistor.

13. The circuit of claim 1, wherein the SAR ADC further comprises a digital-to-analog converter (DAC) having an output coupled to respective inputs of the first and second amplification stages.

14. A method comprising:
performing successive approximation (SAR) analog-to-digital conversion, wherein the performing comprises:
activating a first amplification stage during a first time interval;
with the first amplification stage, causing, during the first time interval, a bi-stable circuit to output an output signal selected from two possible values;
activating a second amplification stage during a second time interval; and
with the second amplification stage, causing, during the second interval, the bi-stable circuit to output the output signal.

15. The method of claim 14, wherein activating the first amplification stage comprises pre-charging the bi-stable circuit.

16. The method of claim 14, wherein the first amplification stage exhibits a first time delay and the second amplification stage exhibits a second time delay, wherein the second time delay is greater than the first time delay.

17. The method of claim 14, wherein the performing further comprises iterating until the analog-to-digital conversion is completed.

18. The method claim 14, further comprising providing a first common mode signal to the first and second amplification stages during the first time interval and providing a second common mode signal, different from the first common mode signal, to the first and second amplification stages during the second time interval.

19. The method claim 17, wherein the performing further comprises performing digital-to-analog conversion of the output signal, and providing the converted output signal to the first and second amplification stages.

20. The method of claim 14, wherein the performing further comprises deactivating the first amplification stage during the second time interval and deactivating the second amplification stage during the first time interval.

* * * * *